United States Patent [19]
Boling et al.

[11] Patent Number: 6,146,155
[45] Date of Patent: Nov. 14, 2000

[54] RECYCLABLE LOCATER DEVICE FOR BOARD MOUNTED CONNECTORS

[75] Inventors: Clyde W. Boling, Austin, Tex.; Dennis M. Brunner, Centralia; Jeffrey J. Bellas, Columbia, both of Mo.

[73] Assignee: 3M Innovative Properties Company, St. Paul, Minn.

[21] Appl. No.: 08/931,183

[22] Filed: Sep. 16, 1997

[51] Int. Cl.[7] .............................. H01R 12/00; H05K 1/00
[52] U.S. Cl. ................................ 439/79; 439/940
[58] Field of Search ................. 439/79, 80, 567, 439/940, 476.1, 574, 575; 200/294

[56] References Cited

U.S. PATENT DOCUMENTS

| | | | |
|---|---|---|---|
| 3,815,077 | 6/1974 | Anhalt et al. | 439/70 |
| 3,873,173 | 3/1975 | Anhalt | 439/71 |
| 3,960,424 | 6/1976 | Weisenburger | 439/66 |
| 4,025,142 | 5/1977 | Huber et al. | |
| 4,488,581 | 12/1984 | Stumpf et al. | 140/147 |
| 4,553,322 | 11/1985 | Cappos et al. | 29/739 |
| 4,664,458 | 5/1987 | Worth | 439/82 |
| 5,133,670 | 7/1992 | Doi et al. | 439/79 |
| 5,242,311 | 9/1993 | Seong | 439/135 |
| 5,244,414 | 9/1993 | Peloza | 435/567 |
| 5,346,404 | 9/1994 | Shimada | 439/108 |
| 5,354,207 | 10/1994 | Chikano | 439/79 |
| 5,487,674 | 1/1996 | Guzik et al. | 439/83 |
| 5,507,657 | 4/1996 | Seto et al. | 439/135 |

FOREIGN PATENT DOCUMENTS

| | | | |
|---|---|---|---|
| 30404/95 | 9/1995 | Australia | H05K 1/18 |
| 0 701 298 A2 | 3/1996 | European Pat. Off. | H01R 9/09 |
| 0 706 314 A1 | 4/1996 | European Pat. Off. | H05K 13/04 |
| WO 99/14828 | 3/1999 | WIPO. | |

*Primary Examiner*—Kheim Nguyen
*Assistant Examiner*—Hae Moon Hyeon
*Attorney, Agent, or Firm*—Matthew B. McNutt

[57] ABSTRACT

A connector locator device for mounting a connector in a connector cut-out formed in a circuit card. An elongated connector includes solder tails extending from an edge thereof. The connector has opposite connector ends. An elongated connector support member has opposite terminal ends. Each terminal end includes a clamp engaging a respective connector end and also includes a support surface for engaging a card surface and locating the solder tails on solder pads positioned on the card surface.

16 Claims, 8 Drawing Sheets

RECYCLABLE LOCATER DEVICE FOR BOARD MOUNTED CONNECTORS

BACKGROUND

The disclosures herein relate generally to a connector for a PCMCIA card and more particularly to supporting the connector so that solder tails are located and positioned for surface mount soldering to the card without the need for clamps or fixtures.

PCMCIA cards and compact flash (CF) cards are well known credit card size printed circuit (PC) boards which provide a memory expansion capability for mobile computers such as notebooks, palmtops, etc. PCMCIA, i.e. Personal Computer Memory Card International Association, is an association which develops standards for memory and input/output (I/O) cards. The utility of PCMCIA cards allows a choice of expansion memory and I/O devices which suit the users' needs.

The cards are mass produced on panels which may each contain 4, 6, 9, 12, etc. cards to be simultaneously formed. Frangible members interconnect the cards during the manufacturing process. Components are mounted on the cards either by hand or by pick-and-place (robotic) automation. The components are interconnected by an array of solder pads which interconnect with conductive paths or traces on the cards. The panel also includes a cut-out portion for placement of a connector. The connector includes a plurality of solder tails. When the connector is inserted into the cut-out portion, the solder tails must be aligned in contact with the solder pads so that a subsequent reflow soldering operation can provide the required connection between the tails and the pads. When completed, the panel is divided up at the frangible connections into the individual cards.

Although sometimes done by hand, preferably, placement of the connector in position for soldering is accomplished by pick and place automation. To assure the success of the automated procedure, certain conditions must be satisfied. The connector must be seated in the cut-out portion so that the solder tails are vertically and horizontally aligned, i.e., coplanar, with the solder pads. The connectors must be stabilized against tilting on the board until soldered in place. Also, the connectors must be conducive to a pick-and-place process. Furthermore, it is important that the solder tails be protected against damage which would bend and misalign them.

As a result of the critical alignment requirements, clamps and/or fixtures have been used to maintain the seated connector in the proper position and orientation so that the solder tails remain aligned and in contact with the solder pads for the soldering operation. These clamps and fixtures are costly because they are custom made for each card configuration and are also manually mounted and applied to the panel.

Therefore, what is needed is an apparatus and method for automatically placing a connector in the proper orientation with each card on the panel and maintaining the solder tails in the proper orientation with the solder pads during the soldering process without the need for manual intervention or the use of clamps and fixtures.

SUMMARY

One embodiment, accordingly, provides a connector which is placed and supported in the cut-out in a manner which avoids the above-mentioned problems. To this end, a connector locator device includes an elongated support member having opposite terminal ends, each end including a resilient clamp for engaging a connector and also including a support surface for engaging a circuit card surface and locating solder tails of the connector on solder pads positioned on the card surface.

A principal advantage of this embodiment is that the connector is stabilized on the card surface and the solder tails are aligned directly onto the solder pads and supported coplanar therewith. Also, the connector locator device can be removed and re-used for subsequent connector placement on other cards.

DETAILED DESCRIPTION OF THE PREFERRED EMBODIMENT

Figure 1:
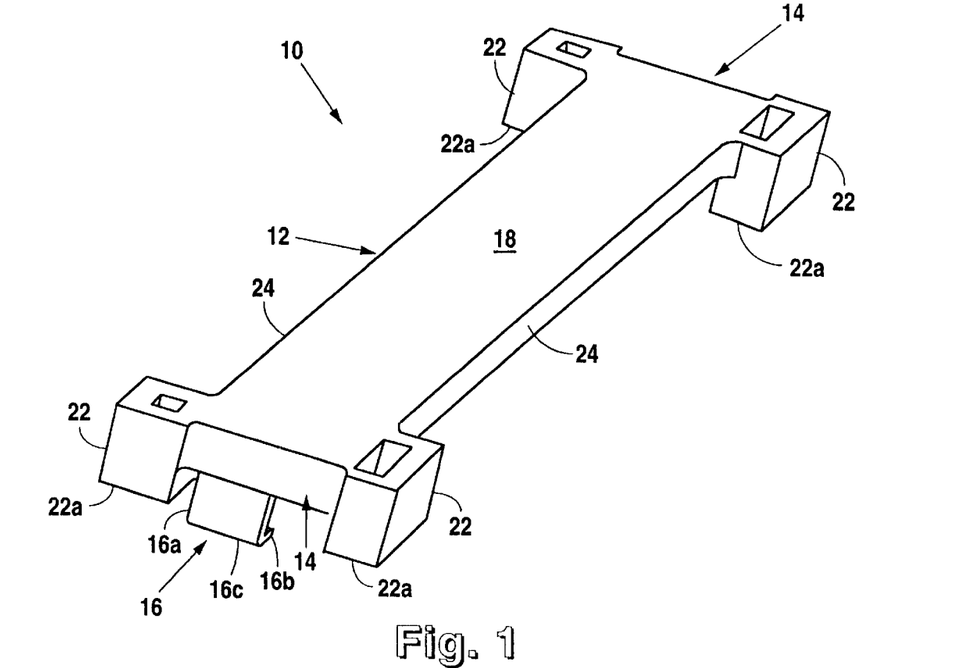
FIG. 1 is an isometric view illustrating an embodiment of a connector locator device.
Figure 2:
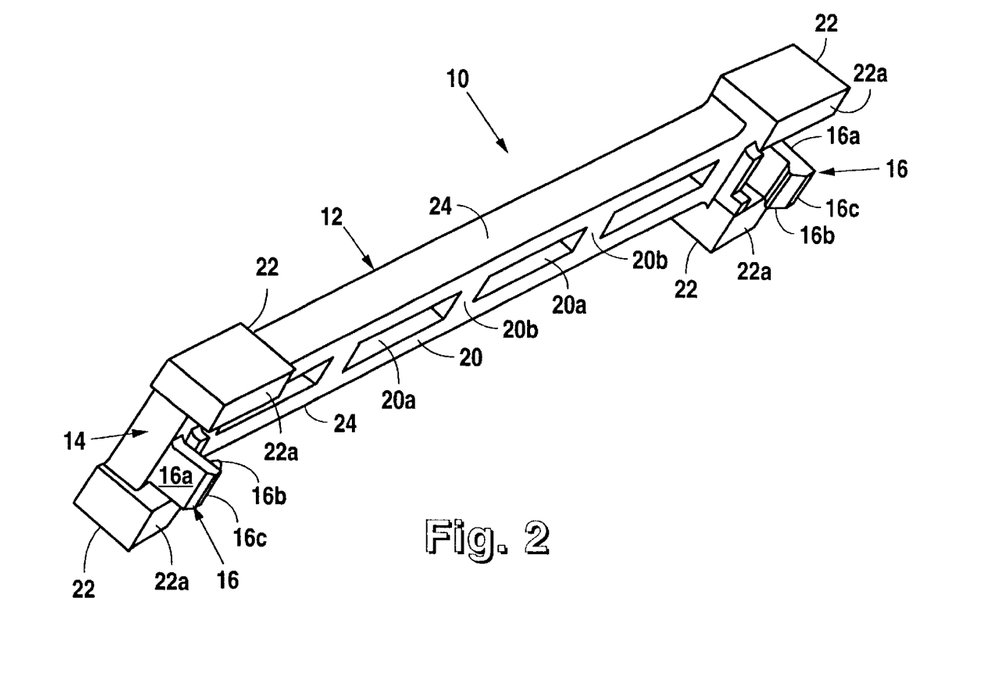
FIG. 2 is an inverted isometric view illustrating an embodiment of the connector locator device of FIG. 1.

A connector locator device, FIG. 1, generally designated 10, is formed of a suitable plastic material and includes an elongated main body portion 12 having a pair of opposite terminal ends 14. Main body 12 includes a first planar surface 18 and a second surface 20, FIG. 2, opposite surface 18. Surface 18 provides an increased area for vacuum pickup during pick-and-place transfer. Surface 20 includes a plurality of voids 20a formed therein for the purpose of reducing the weight of main body 12. A plurality of reinforcing ribs 20b separate voids 20a and provide reinforcement to strengthen body 12. Main body 12 also includes a pair of opposed, elongated edges 24, FIGS. 1 and 2, extending between terminal ends 14.

Each terminal end 14 includes a resilient clamp 16 extending substantially perpendicular therefrom adjacent second surface 20. Each clamp 16 includes a tab portion 16a having a hook portion 16b on a terminal end 16c thereof for engaging and retaining opposite ends of an associated connector, discussed below. Each terminal end 14 also includes a plurality of support legs 22 spaced apart from each other leg 22. A planar surface 22a, FIG. 2, of each leg 22 supports locator device 10 on an associated circuit card, discussed below.

Figure 3:
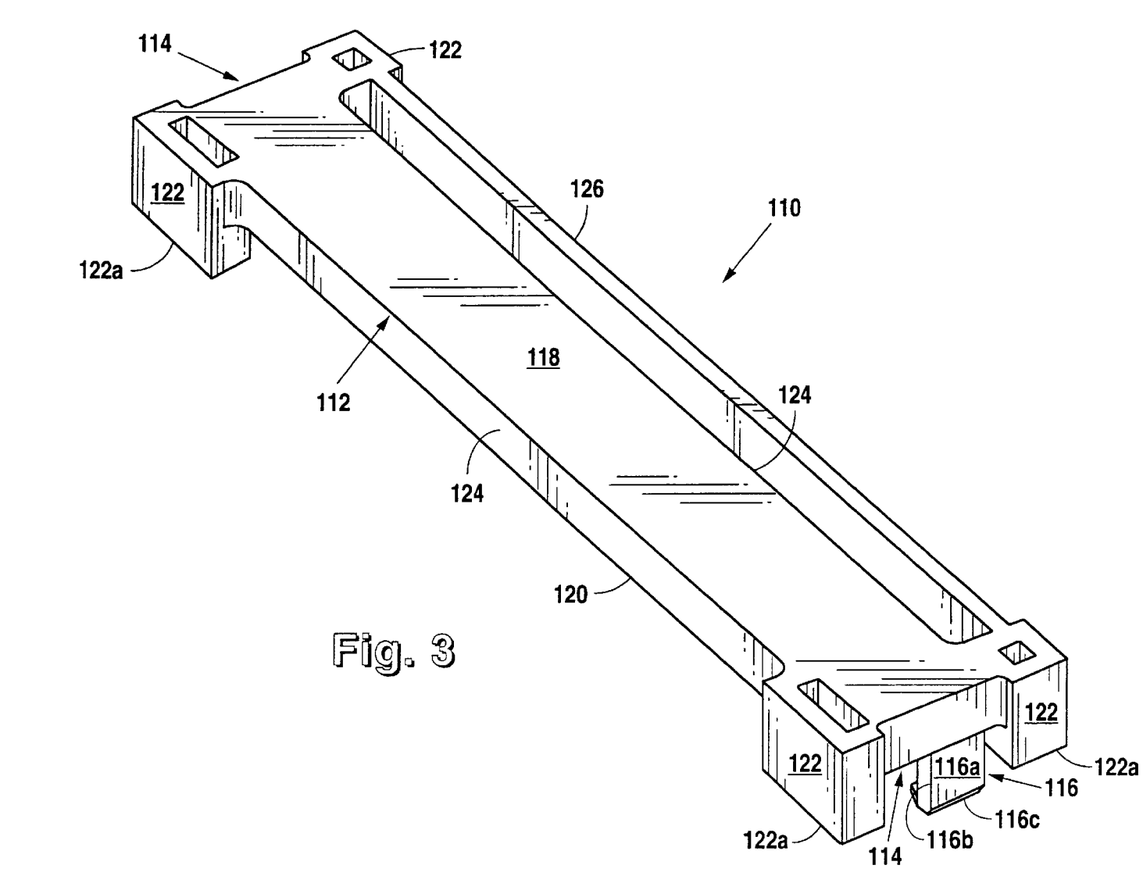
FIG. 3 is an isometric view illustrating an embodiment of a connector locator device including a solder tail guard member.

In another embodiment, FIG. 3, a connector locator device 110 includes an elongated main body portion 112 having a pair of opposite terminal ends 114. Main body 112 includes a first planar surface 118 and a second surface 120, FIG. 4, opposite surface 118. Surface 120 includes a plurality of voids 120a formed therein for weight reduction as stated above. A plurality of reinforcing ribs 120b separate voids 120a and provide reinforcement to strengthen main body 112. Main body 112 also includes a pair of opposed, elongated edges 124 extending between terminal ends 114.

Figure 4:
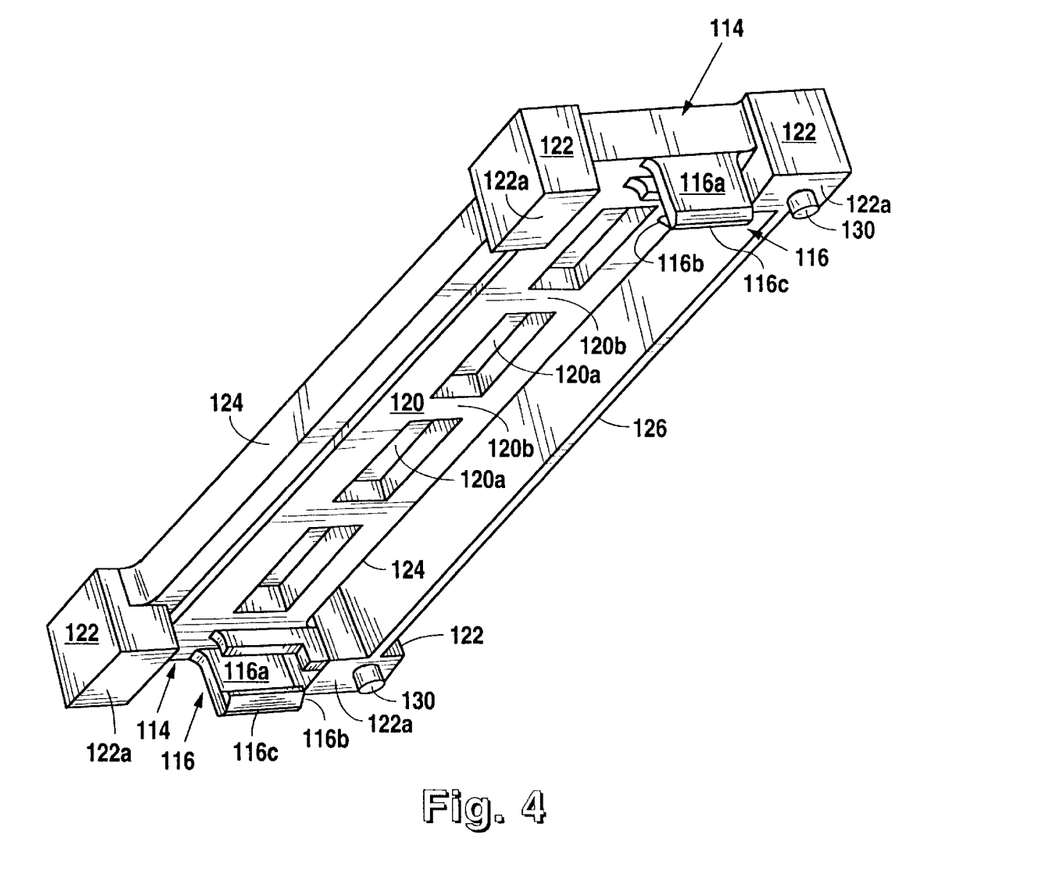
FIG. 4 is an inverted isometric view illustrating an embodiment of the connector locator device of FIG. 3.

Each terminal end 114 includes a resilient clamp 116 extending substantially perpendicular therefrom adjacent second surface 120. Each clamp 116 includes a tab portion 116a having a hook portion 116b on a terminal end 116c thereof for engaging and retaining opposite ends of the above-mentioned connector. Each terminal end 114 also includes a plurality of support legs 122 spaced apart from each other leg 122. A planar surface 122a of each leg 122 supports locator device 110 on the above-mentioned circuit card.

In the embodiment of FIGS. 3 and 4, a guard member 126 extends substantially adjacent to one of the elongated edges 124 of main body 112. Guard member 126 extends substantially parallel to edge 124 between two of the support legs 122 and terminates therewith. Guard member 126 provides protection for, and maintains coplanar alignment of, solder tails of the above-mentioned connector, as will be discussed below. Also, if desired, legs 122 may include extensions 130, FIG. 4, extending from planar surface 122a to function as locator pins for seating into a receiver (not shown in FIGS. 3 and 4) formed in the above-mentioned circuit card.

Figure 5:
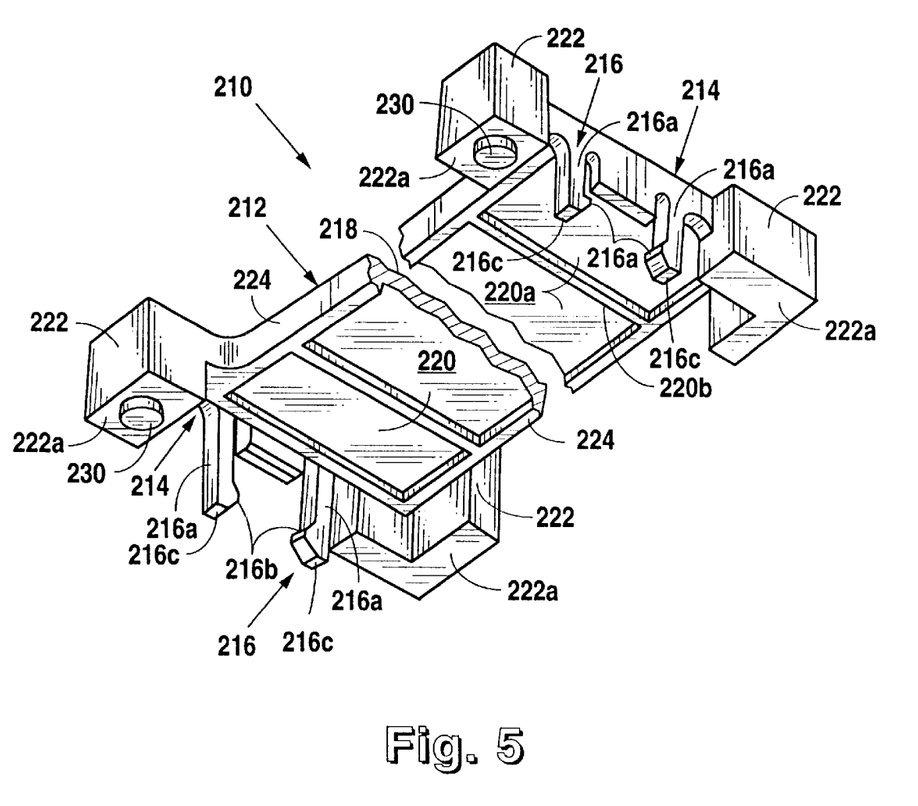
FIG. 5 is an isometric view illustrating an embodiment of a connector locator device having an alternative clamping mechanism.

In a further embodiment, FIG. 5, a connector locator device 210 includes an elongated main body portion 212 having a pair of opposite terminal ends 214. Main body 212 includes a first planar surface 218, not fully shown in FIG. 5, but similar to surface 18 in FIG. 1. Also in FIG. 5, main body 212 includes a second surface 220 opposite surface 218. Surface 220 includes a plurality of voids 220a formed therein for weight reduction as stated above. A plurality of reinforcing ribs 220b separate voids 220a and provide reinforcement to strengthen main body 212. Main body 212 also includes a pair of opposed, elongated edges 224 extending between terminal ends 214.

Each terminal end 214 includes a resilient clamping device 216 extending substantially perpendicular therefrom adjacent second surface 220. Each clamping device 216 comprises a pair of opposed clamps, each including a tab portion 216a and a hook portion 216b on a terminal end 216c thereof for engaging the above-mentioned connector. Each terminal end 214 also includes a plurality of support legs 222 spaced apart from each other leg 222. A planar surface 222a of each leg 222 supports locator device 210 on the above-mentioned circuit card. Locator device 210 may also include a guard member (not shown) similar to guard member 126, described above, if desired, and includes extensions 230, similar to extensions 130, described above.

Figure 6:
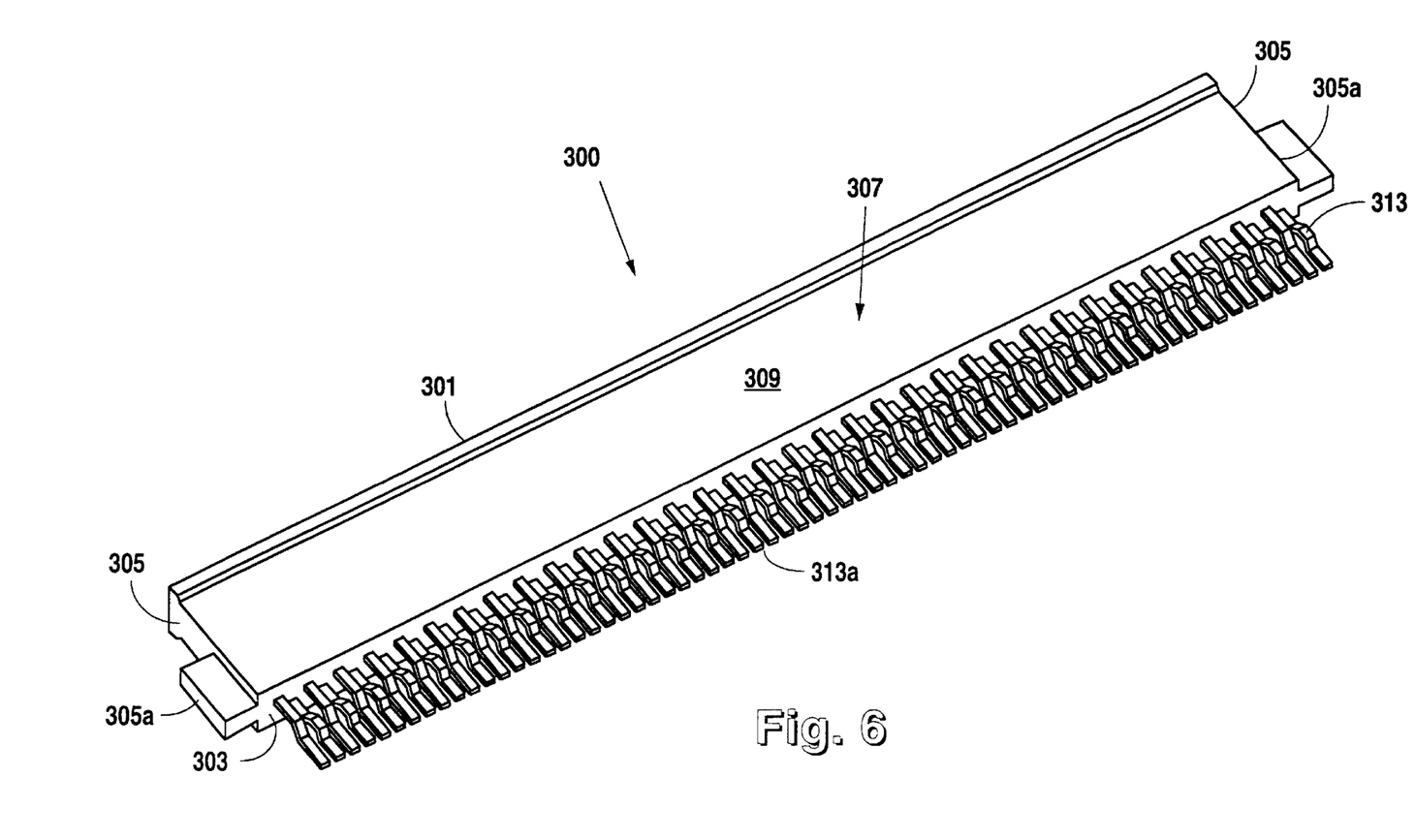
FIG. 6 is an isometric view illustrating an embodiment of a connector.

In FIG. 6, a well known connector is illustrated and is generally designated 300. Connector 300 is in the form of an elongated main body 307 having a pair of opposite ends 305 and a pair of opposed sides 301, 303. Side 301 includes a plurality pin receiving apertures 315, FIG. 8, which extend into main body 307, and side 303, FIG. 6, includes a plurality of solder tails 313 extending therefrom and physically interconnected within body 307 to the above-mentioned apertures for making an electrical connection with pins (not shown) which are inserted into the apertures 315. Solder tail ends 313a are provided for making electrical contact with solder pads on above-mentioned circuit card. Each end 305 includes an ear 305a. Main body 307 also includes a first planar surface 309 and a second planar surface 311, FIG. 7, opposite surface 309.

Figure 7:
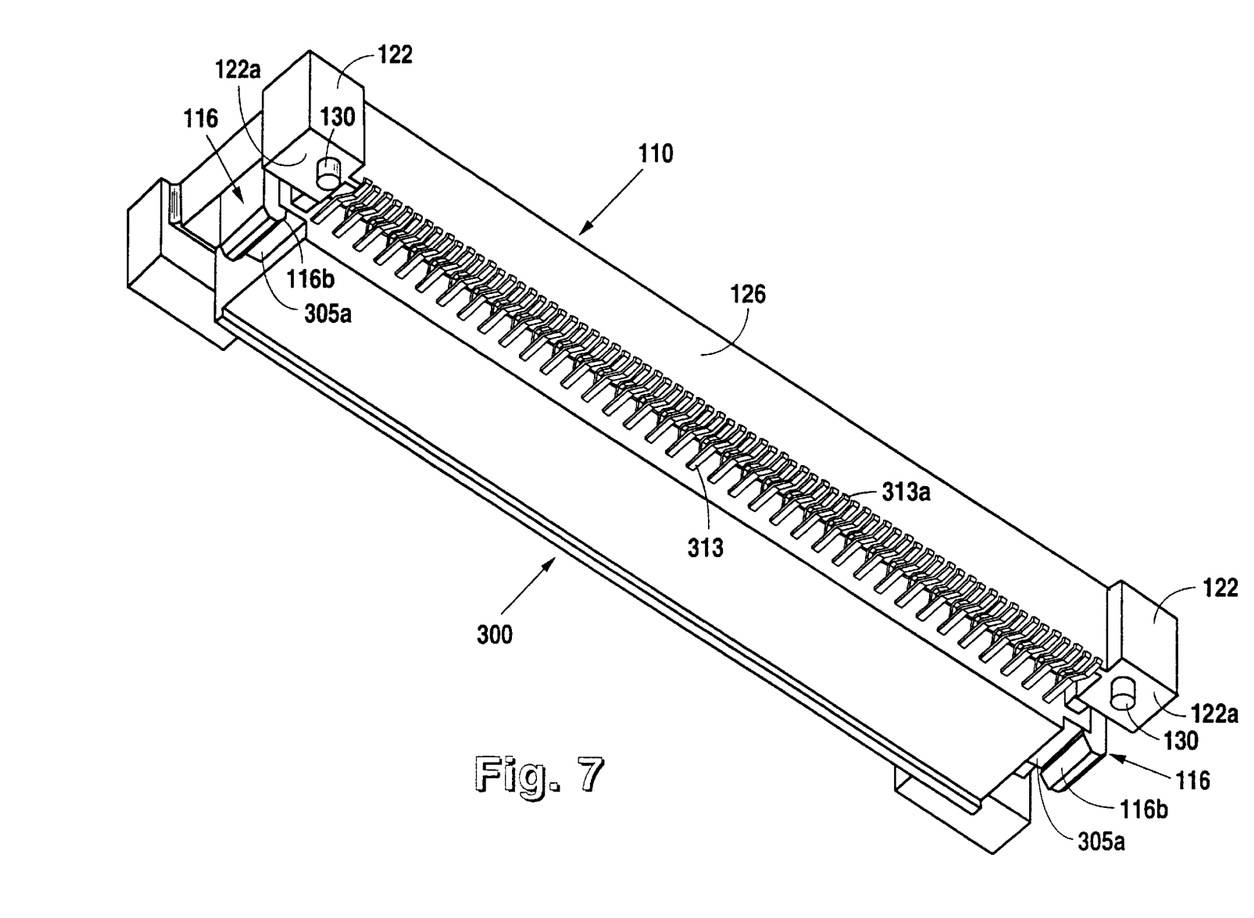
FIG. 7 is an isometric view illustrating an embodiment of the connector locator device engaged with the connector.

In FIG. 7, it can be seen that the connector 300 of FIG. 6 is attached to the locator device 110 of FIG. 3. As such, ears 305a, FIG. 7, of connector 300 are engaged by hooks 116b of clamps 116, and guard member 126 extends adjacent to and thus protects the ends 313a of solder tails 313. Also in FIG. 7, it can be seen that extensions 130, also illustrated in FIG. 4, extend from surface 122a of two of the support legs 122.

Figure 8:
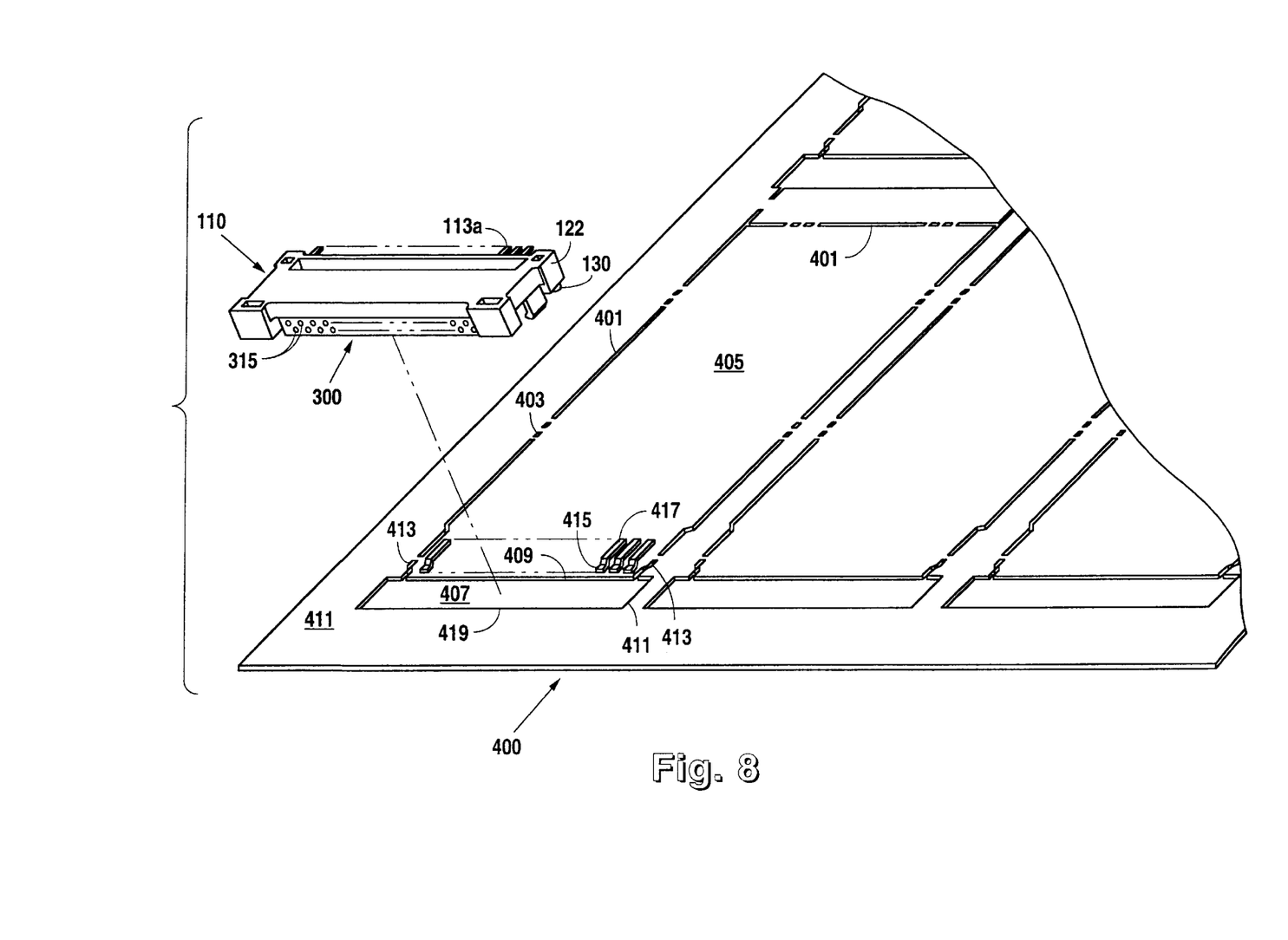
FIG. 8 is an isometric view illustrating an embodiment of the connector locator device positioned above a circuit card.

In operation, FIG. 8, a circuit board panel 400 includes a plurality of cut-outs 401 defining an associated plurality of frangible portions 403 where a circuit card 405 can be separated from panel 400. An enlarged cut-out 407 is provided for seating the locator 110 and connector 300, also illustrated in FIG. 7, adjacent an edge 409 of card 405. The legs 122 of the locator 110 rest on a surface 411 of panel 400 adjacent cut-out 407. The extensions 130, which extend from at least two of the legs 122 of the locator 110, are received by a pair of associated apertures 413 formed in panel 400 adjacent cut-out 407. A plurality of solder pads 415 are also provided along the edge 409 of cut-out 407 and are connected to circuit traces 417 which connect pads 415 to components (not shown) on the card 405, as is well known. Once seated, the solder tail ends 113a are positioned in aligned contact with the pads 415. Also, the pin apertures 315 are positioned along another edge 419 of cut-out 407.

Figure 9:
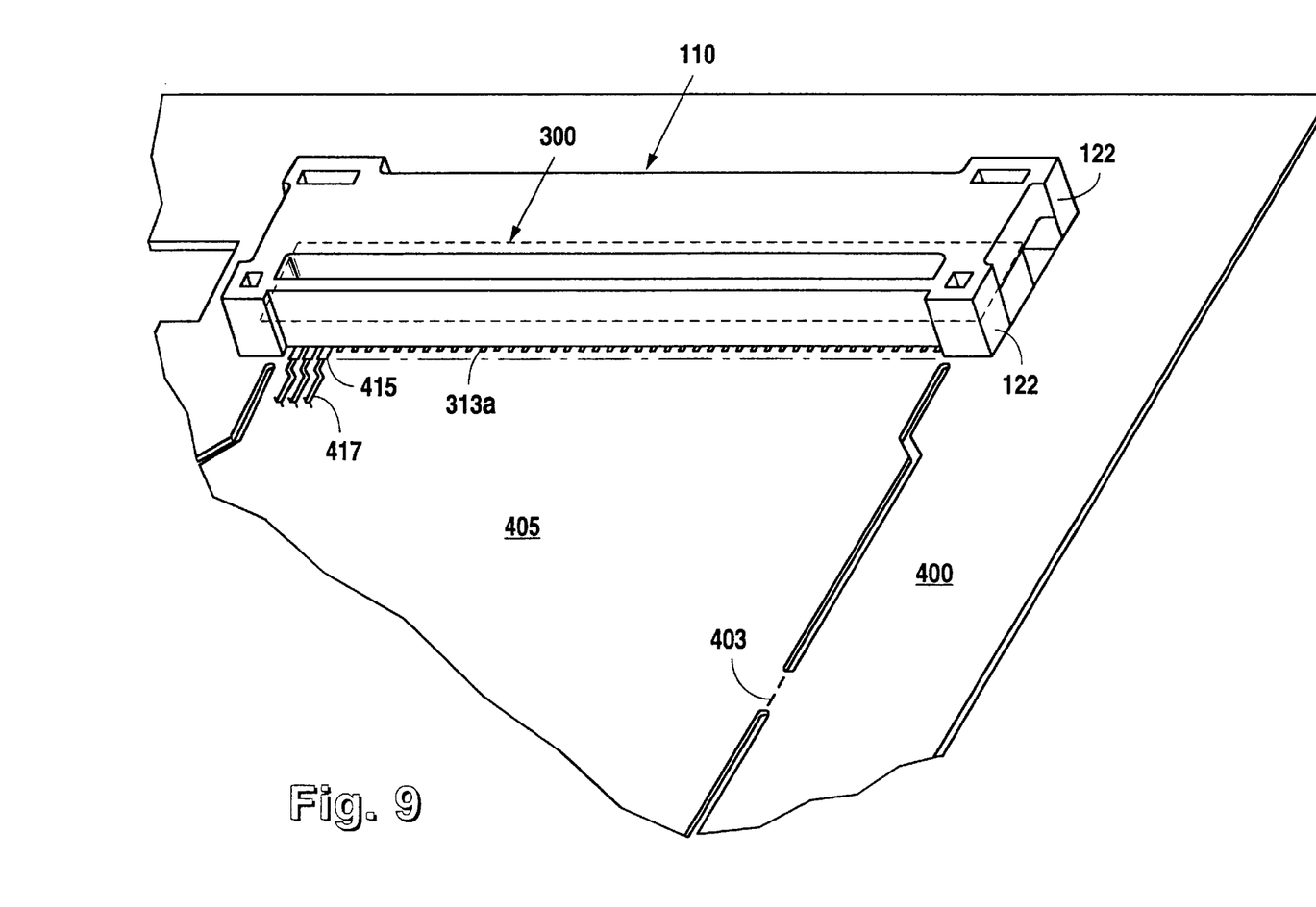
FIG. 9 is an isometric view illustrating an embodiment of the connector locator device engaged with a connector and seated on a circuit card.

In FIG. 9, locator 110 and connector 300 (shown in dotted line) are illustrated as seated on panel 400 with the legs 122 of locator 110 resting on panel 400 and solder tail ends 113a in aligned contact with solder pads 415. After a flow soldering operation is completed, the cards 405 are separated from the panel 400 at the frangible portions 403. The locator devices 110 can be removed from the connectors and recycled for subsequent use.

As it can be seen, the principal advantages of these embodiments are that a connector can be automatically placed in the proper orientation with a circuit card by a connector locator to maintain the solder tails in proper orientation with the solder pads during the solder process without the need for manual intervention or the use of clamps and fixtures. The connector is stabilized on the card surface and the solder tails are aligned directly onto the solder pads and supported coplanar therewith. Also, the connector locator can be removed and reused for subsequent connector placement on other cards.

The recyclable connector locator is a molded plastic device provided for a PCMCIA/CF card connector socket to snap into for orientation purposes. The device is designed with the intention of providing vertical elevation and horizontal location control as well as stabilizing the connector during the steps of a panelized "cracker" printed circuit board manufacturing process while still being easily detached from the connector socket during board separation from each other and the waste areas between them. The locator device also enhances the ability to utilize a pick-and-place transfer system by providing an increased target surface area for vacuum pickup. Also, the locator device may have locator pins and a stationary contact support guard to ensure proper location and coplanar alignment of solder tail contacts to the printed circuit board, thus eliminating the need for costly fixtures that are now used in printed circuit board assembly processes. During shipment of connector sockets, the locator device also acts as a dust cover and provides protection for the contacts, as well as being recyclable because it can be returned to the connector manufacturer and reused.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A removable connector locator device comprising:

an elongated connector support member having opposite terminal ends;

each end including a resilient clamp for engaging a connector; and each end including a support surface for engaging a circuit card surface and temporarily locating solder tails of the connector on solder pads positioned on the circuit card surface.

2. The connector locator device as defined in claim 1 wherein each support surface includes a plurality of support legs.

3. The connector locator device as defined in claim 2 wherein each of the legs is spaced apart from each other leg.

4. The connector locator device as defined in claim 2 wherein at least two of the legs include an extension for seating into a receiver formed in the card surface.

5. The connector locator device as defined in claim 1 wherein each clamp includes a tab having a hook on a terminal end thereof.

6. The connector locator device as defined in claim 1 wherein each clamp includes a pair of opposed tabs having a hook on a terminal end thereof.

7. A connector locator device comprising:

an elongated connector support member having opposite terminal ends;

each end including a resilient clamp for engaging a connector; and each end including a support surface for engaging a circuit card surface and temporarily locating solder tails of the connector on solder pads positioned on the circuit card surface, wherein the support member has an elongated edge extending between the terminal ends for maintaining coplanar alignment of the solder tails of the connector.

8. The connector locator device as defined in claim 7 wherein the support member has a guard extending adjacent the elongated edge thereof.

9. A removable connector locator system comprising:

an elongated connector including solder tails extending from an edge thereof and having opposite connector ends; and an elongated connector support member having opposite terminal ends, each terminal end including a clamp engaging a respective connector end and also including a support surface for engaging a circuit card surface and temporarily locating the solder tails on solder pads positioned on the circuit card surface.

10. The connector locator as defined in claim 9 wherein each support surface includes a plurality of support legs.

11. The connector locator as defined in claim 10 wherein each of the legs is spaced apart from each other leg.

12. The connector locator as defined in claim 10 wherein at least two of the legs include an extension for seating into a receiver formed in the card surface.

13. The connector locator as defined in claim 9 wherein each clamp includes a tab having a hook on a terminal end thereof.

14. The connector locator as defined in claim 9 wherein each clamp includes a pair of opposed tabs having a hook on a terminal end thereof.

15. A connector locator system comprising:

an elongated connector including solder tails extending from an edge thereof and having opposite connector ends; and an elongated connector support member having opposite terminal ends, each terminal end including a clamp engaging a respective connector end and also including a support surface for engaging a circuit card surface and temporarily locating the solder tails on solder pads positioned on the circuit card surface, wherein the support member has an elongated edge extending between the terminal ends for maintaining coplanar alignment of the solder tails of the connector.

16. The connector locator as defined in claim 15 wherein the support member has a guard adjacent the solder tails and extending adjacent the elongated edge thereof.

* * * * *